US010868369B2

United States Patent
Kamio et al.

(10) Patent No.: US 10,868,369 B2
(45) Date of Patent: Dec. 15, 2020

(54) ANTENNA MODULE

(71) Applicant: Murata Manufacturing Co., Ltd., Kyoto (JP)

(72) Inventors: Shigeyuki Kamio, Kyoto (JP); Nobumitsu Amachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/507,309

(22) Filed: Jul. 10, 2019

(65) Prior Publication Data

US 2019/0334250 A1    Oct. 31, 2019

Related U.S. Application Data

(63) Continuation of application No. PCT/JP2017/045087, filed on Dec. 15, 2017.

(30) Foreign Application Priority Data

Jan. 12, 2017 (JP) .................................. 2017-003384

(51) Int. Cl.
*H01Q 21/06* (2006.01)
*H01Q 1/22* (2006.01)
*H01Q 1/48* (2006.01)

(52) U.S. Cl.
CPC ............. *H01Q 21/065* (2013.01); *H01Q 1/22* (2013.01); *H01Q 1/48* (2013.01)

(58) Field of Classification Search
CPC .......... H01Q 21/065; H01Q 1/22; H01Q 1/48; H01Q 1/2283; H01Q 21/20; H05K 3/46
See application file for complete search history.

(56) References Cited

U.S. PATENT DOCUMENTS 7,605,768 B2 * 10/2009 Ebling ................. H01Q 1/3233
                                                343/700 MS
2007/0001918 A1 *  1/2007 Ebling ..................... H01Q 15/02
                                                343/753

(Continued)

FOREIGN PATENT DOCUMENTS

JP    H06-283916 A    10/1994
JP    H09-183110 A     7/1997

(Continued)

OTHER PUBLICATIONS

International Search Report for International Application No. PCT/JP2017/045087, dated Feb. 20, 2018.

(Continued)

*Primary Examiner* — Dameon E Levi
*Assistant Examiner* — David E Lotter
(74) *Attorney, Agent, or Firm* — Pearne & Gordon LLP

(57) ABSTRACT

A base part (110) has one main surface (111) that is spherically curved so as to protrude outward and another main surface (112) that is flat. A plurality of antenna elements (130) are provided along the one main surface (111) inside the base part (110). A plurality of connection wiring lines (150) connect the plurality of connection terminals (120) and the plurality of antenna elements (130) to each other. A part of each of the plurality of connection wiring lines (150) disposed in a region where a ground wiring line (140) is provided extends in a direction perpendicular to the other main surface (112) when viewed in a direction perpendicular to the other main surface (112).

9 Claims, 14 Drawing Sheets

(56) References Cited

U.S. PATENT DOCUMENTS

2019/0089044 A1* 3/2019 Kobuke ............ H01L 23/49822
2019/0297726 A1* 9/2019 Yazaki ..................... H05K 1/14

FOREIGN PATENT DOCUMENTS

| JP | H11-214851 A | 8/1999 |
| JP | 2003-133693 A | 5/2003 |
| JP | 2015-171070 A | 9/2015 |
| WO | 2008/061107 A2 | 5/2008 |

OTHER PUBLICATIONS

Written Opinion for International Application No. PCT/JP2017/045087, dated Feb. 20, 2018.

* cited by examiner

ANTENNA MODULE

This is a continuation of International Application No. PCT/JP2017/045087 filed on Dec. 15, 2017 which claims priority from Japanese Patent Application No. 2017-003384 filed on Jan. 12, 2017. The contents of these applications are incorporated herein by reference in their entireties.

BACKGROUND OF THE DISCLOSURE

Field of the Disclosure

The present disclosure relates to an antenna module and in particular relates to an antenna module that includes a multilayer substrate.

Description of the Related Art

Japanese Unexamined Patent Application Publication No. 9-183110 (Patent Document 1) is a prior art document that discloses the configuration of a curved surface multilayer ceramic sheet that is formed by stacking ceramic green sheets and has a semicircular vertical cross section.

The curved surface multilayer ceramic sheet disclosed in Patent Document 1 includes a lower green sheet having a semicircular vertical cross section, an upper green sheet that is provided on the lower green sheet, and a ceramic film that is provided on the upper surface of the upper green sheet. The upper green sheet curves along the semicircular shape of the lower green sheet. The upper green sheet is integrally molded with the lower green sheet and has a uniform thickness in the vertical cross section thereof. The upper green sheet has a patch antenna on the upper surface thereof and has a ground pattern on the lower surface thereof. In the case where the curved surface multilayer ceramic sheet is manufactured to be a multilayer circuit substrate, a plurality of the upper green sheets are stacked and pressure bonded to each other.

Patent Document 1: Japanese Unexamined Patent Application Publication No. 9-183110

BRIEF SUMMARY OF THE DISCLOSURE

In the case where a plurality of the upper green sheets are stacked such that the upper green sheets are curved, an upper green sheet disposed on a lower side and an upper green sheet disposed on an upper side have different curvatures from each other. Therefore, in the case where a conductor pattern provided on the upper green sheet disposed on the lower side and a conductor pattern provided on the upper green sheet disposed on the upper side are joined to each other by a via conductor provided in the upper green sheets, the via conductor will be diagonally inclined and the electrical connections will be unstable. Furthermore, in the case where lands having a large area are formed at the places where the via conductor is connected in order to secure stable electrical connections, the impedance of a load connected to an antenna will become discontinuous and the efficiency of the antenna will decrease.

The present disclosure was made in light of the above-described problem and it is an object thereof to provide an antenna module having stable electrical connections and having good efficiency.

An antenna module according to the present disclosure includes: a base part; a plurality of connection terminals for external connections; a plurality of antenna elements; a plurality of connection wiring lines; and a ground wiring line. The base part has one main surface that is spherically curved so as to protrude outward and another main surface that is flat. The base part is composed of a dielectric. The plurality of connection terminals for external connections are provided on the other main surface of the base part. The plurality of antenna elements are provided along the one main surface inside the base part. The plurality of connection wiring lines connect the plurality of connection terminals and the plurality of antenna elements to each other. The ground wiring line is provided inside the base part. The ground wiring line is arranged so as to surround a part of each of the plurality of connection wiring lines and is grounded. A part of each of the plurality of connection wiring lines disposed in the region where the ground wiring line is provided extends in a direction perpendicular to the other main surface when viewed in a direction perpendicular to the other main surface.

In an aspect of the present disclosure, the ground wiring line is formed as a result of a plurality of ground layers, which are disposed at positions so as to partially overlap with each other when viewed in a direction perpendicular to the other main surface, are connected to each other by via conductors.

In an aspect of the present disclosure, the antenna module further includes a cover layer. The cover layer covers the one main surface of the base part. The cover layer is formed of a material having a dielectric constant between the dielectric constant of the dielectric and the dielectric constant of air.

In an aspect of the present disclosure, the antenna module further includes a plurality of radiation electrodes. The plurality of radiation electrodes are provided on the cover layer. The plurality of radiation electrodes are supplied with power from the plurality of antenna elements.

In an aspect of the present disclosure, the antenna module further includes an electronic component. The electronic component is mounted on the other main surface of the base part. The electronic component is connected to some of the connection terminals among the plurality of connection terminals.

According to the present disclosure, efficiency of an antenna module can be improved while making electrical connections of the antenna module stable.

DETAILED DESCRIPTION OF THE DISCLOSURE

Figure 1:
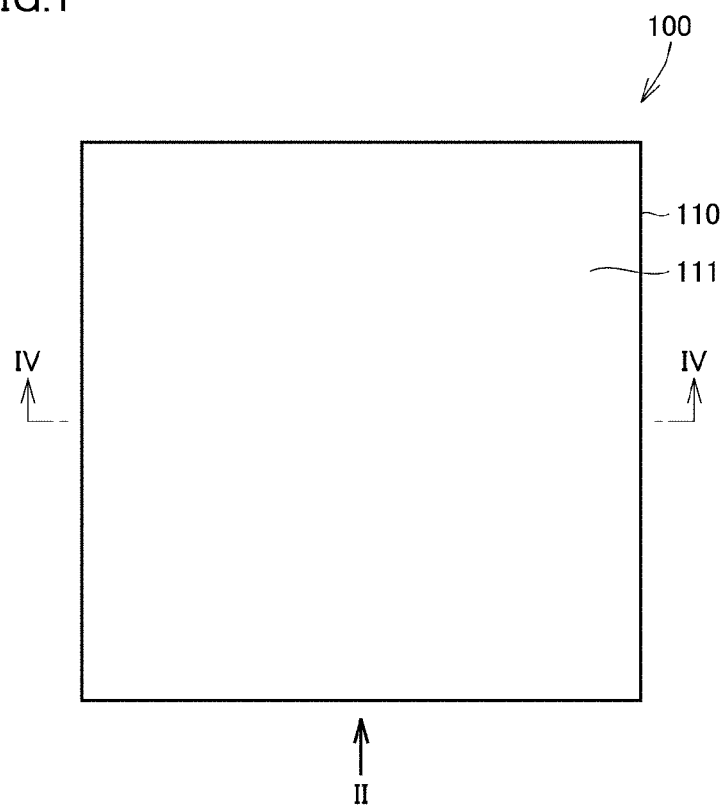
FIG. 1 is a plan view illustrating the exterior of an antenna module according to embodiment 1 of the present disclosure.

Hereafter, antenna modules according to embodiments of the present disclosure will be described while referring to the drawings. In the following description of the embodiments, identical or equivalent parts in the drawings are denoted by the same symbols and the repeated description thereof is omitted.

Embodiment 1

Figure 2:
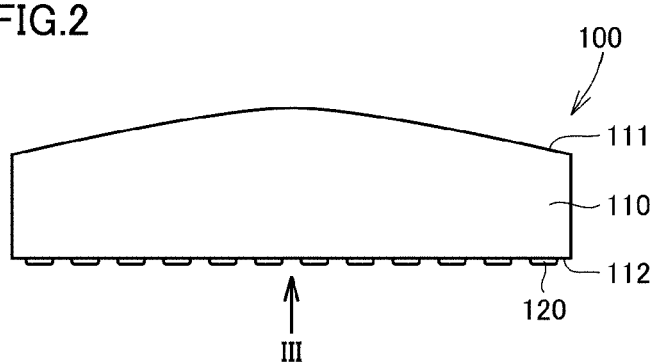
FIG. 2 is a side view in which the antenna module in FIG. 1 is viewed in the direction of arrow II.
Figure 3:
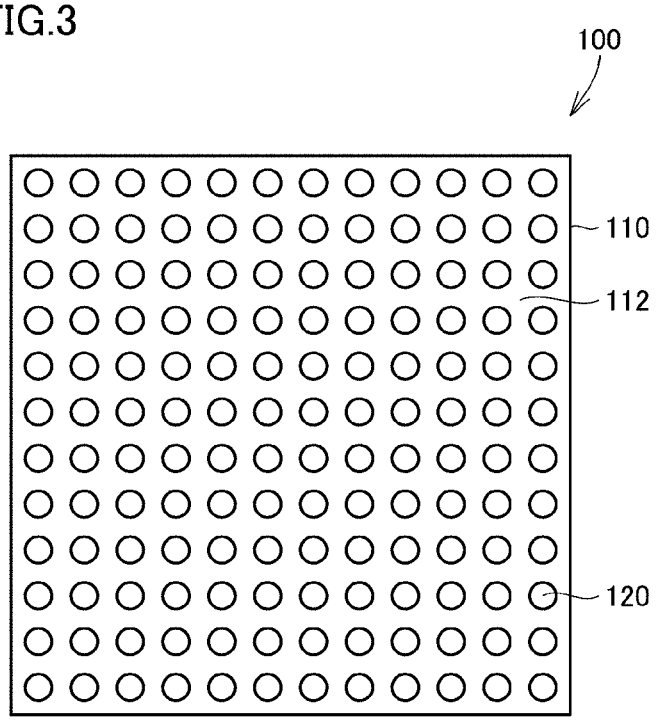
FIG. 3 is a rear view in which the antenna module in FIG. 2 is viewed in the direction of arrow III.
Figure 4:
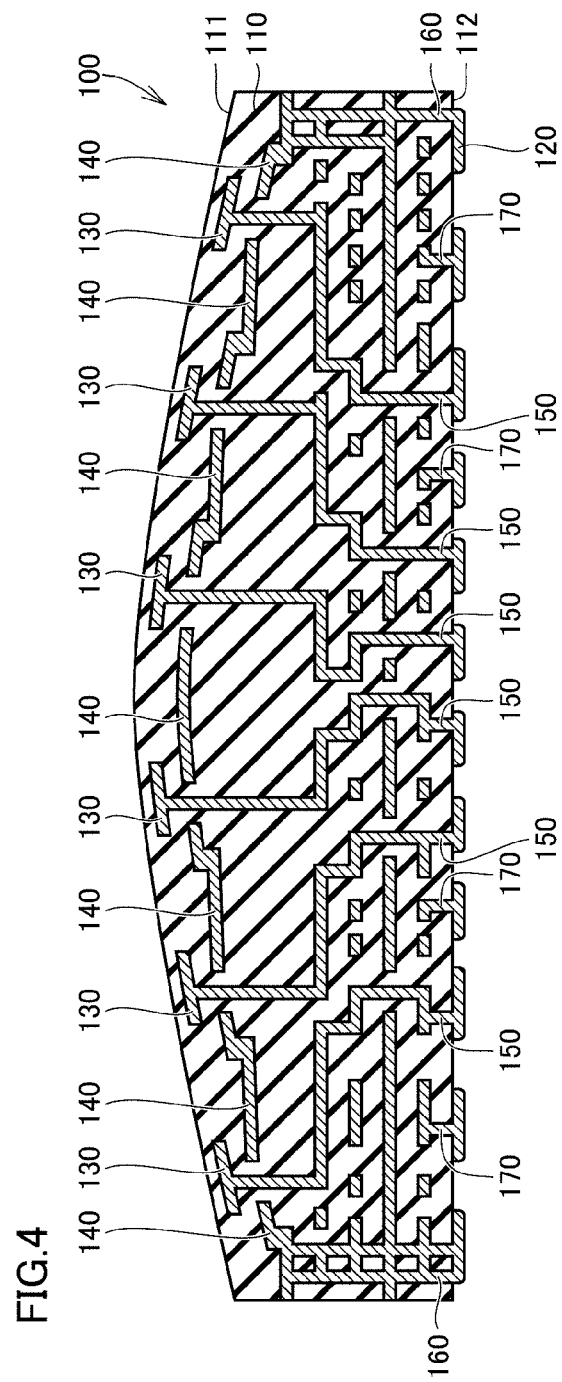
FIG. 4 is a sectional view in which the antenna module in FIG. 1 is viewed in the direction of the arrows of line IV-IV.

FIG. 1 is a plan view illustrating the exterior of an antenna module according to embodiment 1 of the present disclosure. FIG. 2 is a side view in which the antenna module in FIG. 1 is viewed in the direction of arrow II. FIG. 3 is a rear view in which the antenna module in FIG. 2 is viewed in the direction of arrow III. FIG. 4 is a sectional view in which the antenna module in FIG. 1 is viewed in the direction of the arrows of line IV-IV.

As illustrated in FIGS. 1 to 4, an antenna module 100 according to embodiment 1 of the present disclosure includes: a base part 110; a plurality of connection terminals 120 that are for external connections; a plurality of antenna elements 130; a plurality of connection wiring lines 150; and a ground wiring line 140. The antenna module 100 further includes a plurality of connection wiring lines 160 and a plurality of connection wiring lines 170. The antenna module 100 according to this embodiment functions as a conformal array antenna.

The base part 110 has one main surface 111 that is spherically curved so as to protrude outward and has another main surface 112 that is flat. The base part 110 is composed of a dielectric. The plurality of connection terminals 120, which are for external connections, are provided on the other main surface 112 of the base part 110. The plurality of antenna elements 130 are provided along the one main surface 111 inside the base part 110.

The plurality of connection wiring lines 150 connect a group of the connection terminals 120 among the plurality of connection terminals 120 and the plurality of antenna elements 130 to each other with a one-to-one correspondence. However, a plurality of antenna elements 130 may be connected to one connection terminal 120 by a plurality of connection wiring lines 150.

The ground wiring line 140 is provided inside the base part 110. The ground wiring line 140 is arranged so as to surround a part of each of the plurality of connection wiring lines 150 and is grounded. A part of each of the plurality of connection wiring lines 150 that is disposed in the region where the ground wiring line 140 is provided extends in a direction perpendicular to the other main surface 112 when viewed in a direction perpendicular to the other main surface 112. The ground wiring line 140 functions as an antenna electric wall.

The plurality of connection wiring lines 160 connect another group of the connection terminals 120 among the plurality of connection terminals 120 and the ground wiring line 140 to each other. The plurality of connection wiring lines 170 are connected to yet another group of the connection terminals 120 among the plurality of connection terminals 120 and form a circuit.

Figure 5:
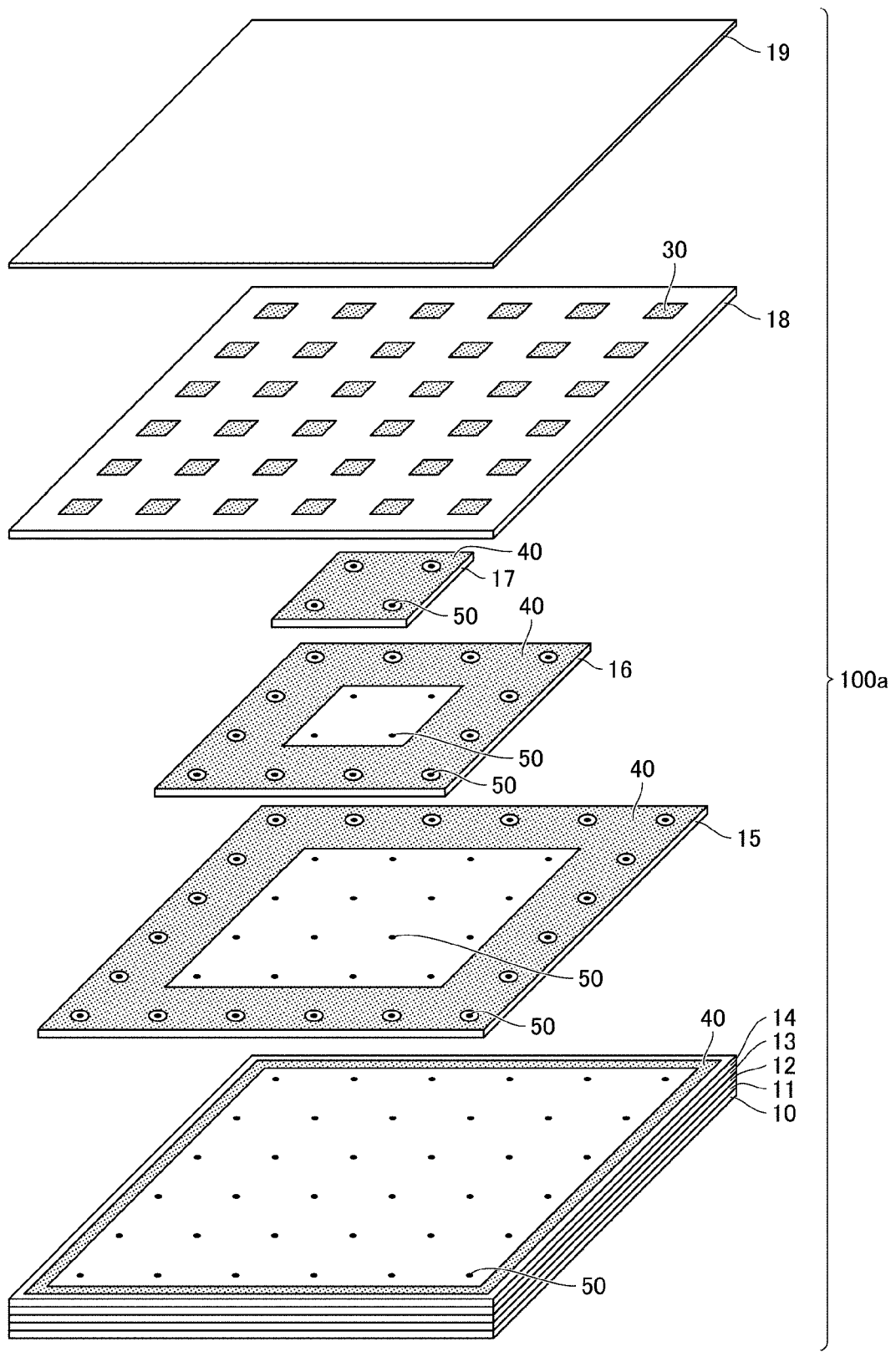
FIG. 5 is an exploded perspective view illustrating a part of a multilayer structure consisting of a plurality of green sheets forming the antenna module according to embodiment 1 of the present disclosure, the part of the multilayer structure corresponding to one antenna module.
Figure 6:
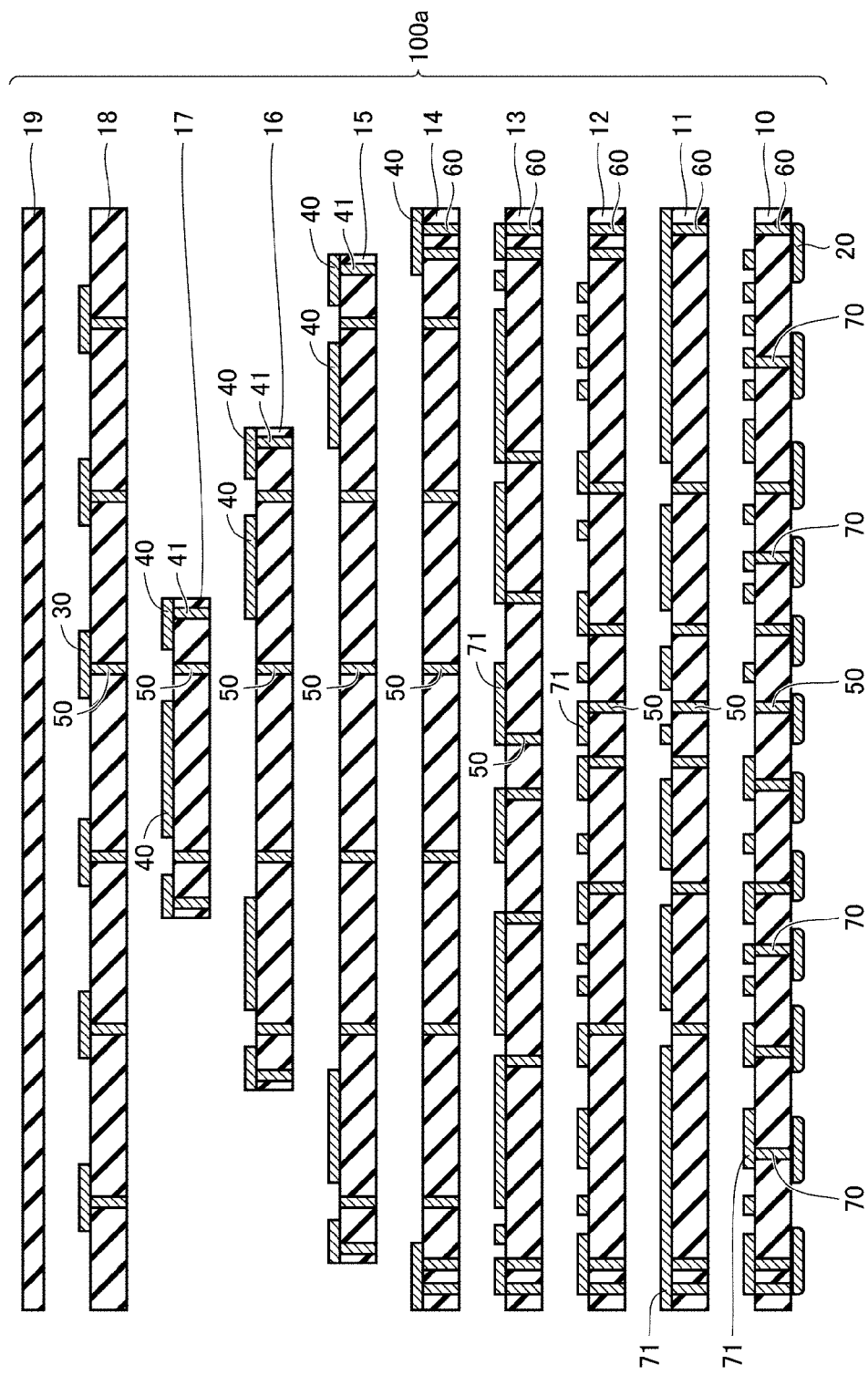
FIG. 6 is a sectional view illustrating a part of the multilayer structure consisting of a plurality of green sheets forming the antenna module according to embodiment 1 of the present disclosure, the part of the multilayer structure corresponding to one antenna module.

Hereafter, a method of manufacturing the antenna module 100 according to this embodiment will be described. FIG. 5 is an exploded perspective view illustrating a part of a multilayer structure consisting of a plurality of green sheets forming the antenna module according to embodiment 1 of the present disclosure, the part of the multilayer structure corresponding to one antenna module. FIG. 6 is a sectional view illustrating a part of the multilayer structure consisting of a plurality of green sheets forming the antenna module according to embodiment 1 of the present disclosure, the part of the multilayer structure corresponding to one antenna module.

Figure 7:
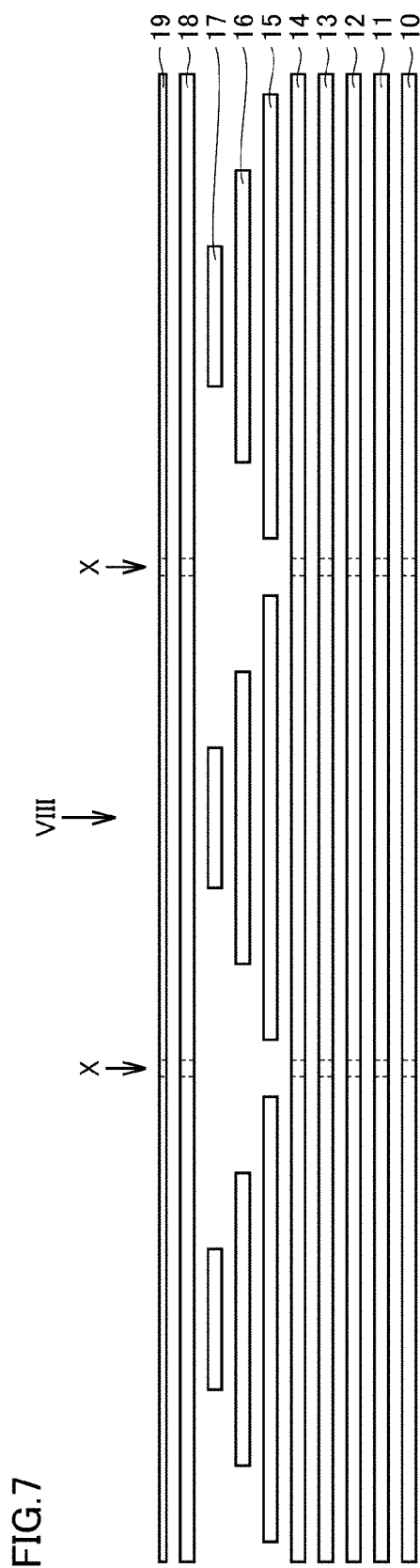
FIG. 7 is an exploded side view illustrating the multilayer structure consisting of a plurality of green sheets forming the antenna modules according to embodiment 1 of the present disclosure.
Figure 8:
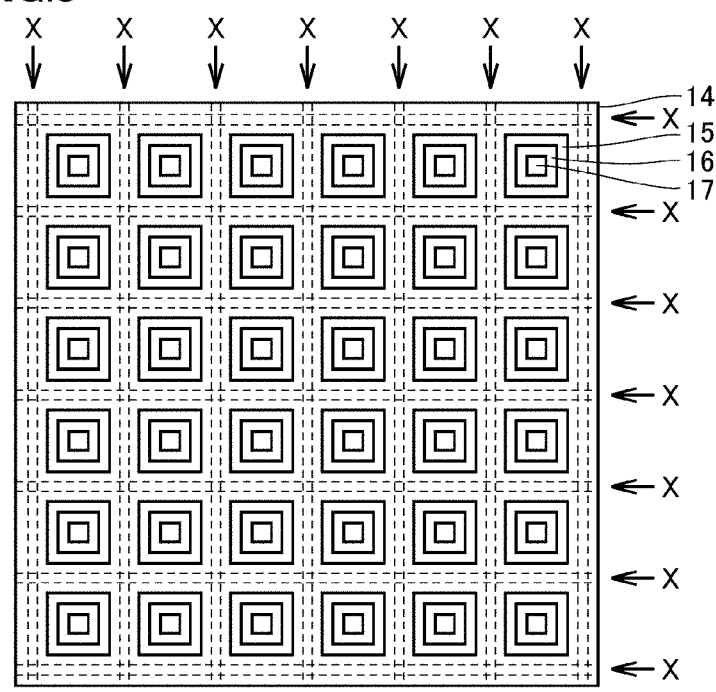
FIG. 8 is a plan view in which the multilayer structure consisting of a plurality of green sheets in FIG. 7 is viewed in the direction of arrow VIII.
Figure 9:
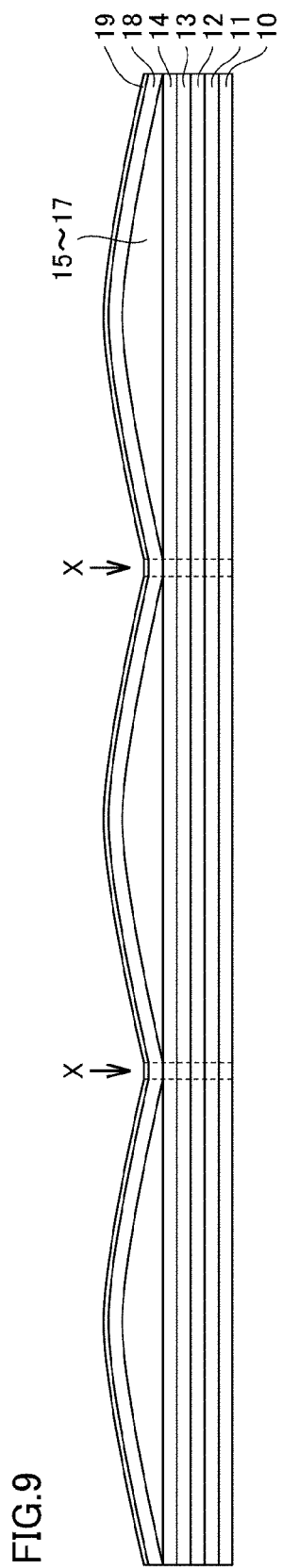
FIG. 9 is a plan view illustrating a state in which the plurality of green sheets forming the antenna modules according to embodiment 1 of the present disclosure have been pressure bonded.

FIG. 7 is an exploded side view illustrating the multilayer structure consisting of a plurality of green sheets forming the antenna module according to embodiment 1 of the present disclosure. FIG. 8 is a plan view in which the multilayer structure consisting of a plurality of green sheets in FIG. 7 is viewed in the direction of arrow VIII. FIG. 9 is a plan view illustrating a state in which the plurality of green sheets forming the antenna module according to embodiment 1 of the present disclosure have been pressure bonded.

FIG. 5 does not illustrate via conductors that connect a plurality of ground layers, which will be described later, to each other. Furthermore, FIG. 5 does not illustrate via conductors that ground the conductor patterns 40 which will be described later. FIGS. 7 to 9 do not illustrate conductor patterns and via conductors provided on and in the green sheets. FIG. 8 illustrates green sheets 18 and 19, which will be described later, in a transparent manner.

As illustrated in FIGS. 5 to 8, when the antenna module 100 according to embodiment 1 of the present disclosure is manufactured, first, a multilayer body 100a, which is formed by stacking a plurality of green sheets 10 to 19, is formed.

The plurality of green sheets 10 to 19 are formed of a mixed powder consisting of alumina and glass or the like and an organic binder and so forth. Conductor patterns and via conductors provided on and in the plurality of green sheets 10 to 19 are formed of a metal having a low electrical resistance such as silver or copper.

Conductor patterns 71 are provided on one main surface of the green sheet 10. Conductor patterns 20, which will form a plurality of connection terminals 120, are provided in an array pattern on the other main surface of the green sheet 10. Via conductors 50, which form a part of the connection wiring lines 150, via conductors 60, which form a part of the connection wiring lines 160, and via conductors 70, which form a part of the connection wiring lines 170, are provided in the green sheet 10.

A green sheet 11 is arranged on the one main surface of the green sheet 10. A green sheet 12 is arranged on one main surface of the green sheet 11. A green sheet 13 is arranged on one main surface of the green sheet 12.

Conductor patterns 71 are provided on the one main surface of each of the green sheets 11 to 13. Via conductors 50, which form a part of the connection wiring lines 150, and via conductors 60, which form a part of the connection wiring lines 160, are provided in each of the green sheets 11 to 13.

In each of the green sheets 10 to 13, a group of the conductor patterns 71 form a part of the connection wiring lines 150, another group of the conductor patterns 71 form a part of the connection wiring lines 160, and yet another group of the conductor patterns 71 form a part of the connection wiring lines 170.

A green sheet 14 is arranged on the one main surface of the green sheet 13. A conductor pattern 40, which forms a part of the ground wiring line 140, is provided on one main surface of the green sheet 14. A part of the conductor pattern 40 provided on the green sheet 14 that corresponds to one antenna module 100 is provided so as to have a rectangular frame shape.

Via conductors 50, which form a part of the connection wiring lines 150, and via conductors 60, which form a part of the connection wiring lines 160, are provided in the green sheet 14. The via conductors 50 corresponding to one antenna module 100 are provided in the green sheet 14 in an array pattern inside a region surrounded by the conductor pattern 40 provided in a rectangular frame shape.

The green sheets 10 to 14 have rectangular outer shapes having substantially identical areas. As illustrated in FIG. 8, the green sheets 10 to 14 are formed to be of such a size as to correspond to a plurality of antenna modules 100. The green sheets 10 to 14 are stacked to form a substantially rectangular parallelepiped shaped body.

Green sheets 15 are arranged on one main surface of the green sheet 14. Each of green sheets 16 is arranged on one main surface of each of the green sheets 15. Each of green sheets 17 is arranged on one main surface of each of the green sheets 16. The green sheets 14 to 17 are arranged one by one on the parts of the green sheet 14 corresponding to one antenna module 100.

The green sheets 15 to 17 have rectangular outer shapes having different areas from each other. The area of the outer shape of each green sheet 15 is smaller than the area of each part of the green sheet 14 corresponding to one antenna module 100. The area of the outer shape of each green sheet 16 is smaller than the area of the outer shape of each green sheet 15. The area of the outer shape of each green sheet 17 is smaller than the area of the outer shape of each green sheet 16. As illustrated in FIGS. 6 to 8, the green sheets 15 to 17 are stacked in pyramid shapes.

Conductor patterns 40, which form a part of the ground wiring line 140, are provided on one main surface of each of the green sheets 15 to 17. The conductor patterns 40 provided on the individual green sheets 15 and 16 are provided so as to have rectangular frame shapes. Each of the conductor patterns 40 provided on each green sheet 17 covers one main surface of the green sheet 17.

An outer peripheral part of each of the conductor patterns 40 provided on each green sheet 15 is superposed with an inner peripheral part of the corresponding conductor pattern 40 provided on the green sheet 14. An outer peripheral part of each of the conductor patterns 40 provided on each green sheet 16 is superposed with an inner peripheral part of the conductor pattern 40 provided on the corresponding green sheet 15. An outer peripheral part of each of the conductor patterns 40 provided on each green sheet 17 is superposed with an inner peripheral part of the conductor pattern 40 provided on the corresponding green sheet 16.

Via conductors 50, which form a part of the connection wiring lines 150, and via conductors 41, which form a part of the ground wiring line 140, are provided in each of the green sheets 15 to 17. The via conductors 50 in each green sheet 15 are arranged so as to be positioned directly above the corresponding via conductors 50 in the green sheet 14. The via conductors 50 in each green sheet 16 are arranged so as to be positioned directly above the corresponding via conductors 50 in the green sheet 15. The via conductors 50 in each green sheet 17 are arranged so as to be positioned directly above the corresponding via conductors 50 in the green sheet 16.

Via conductors 41 in each green sheet 15 are connected to an outer peripheral part of the conductor pattern 40 provided on the green sheet 15. Via conductors 41 in each green sheet 16 are connected to an outer peripheral part of the conductor pattern 40 provided on the green sheet 16. Via conductors 41 in each green sheet 17 are connected to an outer peripheral part of the conductor pattern 40 provided on the green sheet 17.

The conductor patterns 40 and the via conductors 50 are not electrically connected to each other in the green sheets 15 and 17. Specifically, openings are provided in the conductor patterns 40 so as to correspond to the positions of the via conductors 50 in the green sheets 15 to 17.

A green sheet 18 is arranged on one main surface of each of the green sheets 17. The green sheet 18 has a rectangular outer shape having substantially the same area as the green sheets 10 to 14. Conductor patterns 30 that form the plurality of antenna elements 130 are provided on one main surface of the green sheet 18. The conductor patterns 30 corresponding to one antenna module 100 are provided in an array pattern on the green sheet 18.

Via conductors 50 that form a part of the connection wiring lines 150 are provided in the green sheet 18. The via conductors 50 corresponding to one antenna module 100 in the green sheet 18 are provided in an array pattern so as to correspond to the conductor patterns 30. The via conductors 50 in the green sheet 18 are arranged so as to be positioned directly above the corresponding via conductors 50 in the green sheets 14 to 17.

A green sheet 19 is arranged on one main surface of the green sheet 18. The green sheet 19 has a rectangular outer shape having substantially the same area as the green sheets 10 to 14 and 18.

As illustrated in FIG. 9, the green sheets 18 and 19 are deformed along the pyramid shapes of the green sheets 15 to 17 by pressure bonding thus-formed multilayer body 100a using an isotropic press method or the like. At this time, the outer peripheral portion of each set of green sheets 15 to 17 is deformed so as to be squashed. As a result, the one main surface side of the multilayer body 100a is shaped so as to be spherically curved so as to protrude outward in each part corresponding to one antenna module 100. The other main surface side of the multilayer body 100a retains its flat shape.

The conductor patterns 30 corresponding to one antenna module 100 on the green sheet 18 have shapes that follow the spherically curved shape of the one main surface side of the multilayer body 100a. The outer peripheral parts of the conductor patterns 40 provided on the green sheets 15 to 17 have shapes that follow the spherically curved shape of the one main surface side of the multilayer body 100a.

The via conductors 41 in the green sheet 15 connect the conductor pattern 40 provided on the green sheet 14 and the conductor pattern 40 provided on the green sheet 15 to each other in a squashed state. The via conductors 41 in the green sheet 16 connect the conductor pattern 40 provided on the green sheet 15 and the conductor pattern 40 provided on the green sheet 16 to each other in a squashed state. The via conductors 41 in the green sheet 17 connect the conductor pattern 40 provided on the green sheet 16 and the conductor pattern 40 provided on the green sheet 17 to each other in a squashed state.

The conductor pattern 40 provided on the green sheet 14 is electrically connected to the corresponding conductor patterns 20 as a result of the via conductors 60 in the green sheets 10 to 14 and the corresponding conductor patterns 71 provided on the green sheets 10 to 13 being connected to each other.

The via conductors 50 in the green sheets 14 to 17 are connected to each other while extending in a direction perpendicular to the other main surface of the multilayer body 100a. The corresponding conductor patterns 30 and conductor patterns 20 are electrically connected to each other as a result of the corresponding via conductors 50 in the green sheets 10 to 18 and the corresponding conductor patterns 71 provided on the green sheets 10 to 13 being connected to each other.

The antenna modules 100 illustrated in FIGS. 1 to 4 can be formed by firing the multilayer body 100a at a heating temperature of around 900° C. After that, a plurality of antenna modules 100 can be manufactured by cutting the multilayer body 100a into individual pieces along cutting lines X illustrated in FIGS. 7 to 9 using a dicing machine.

Figure 10:
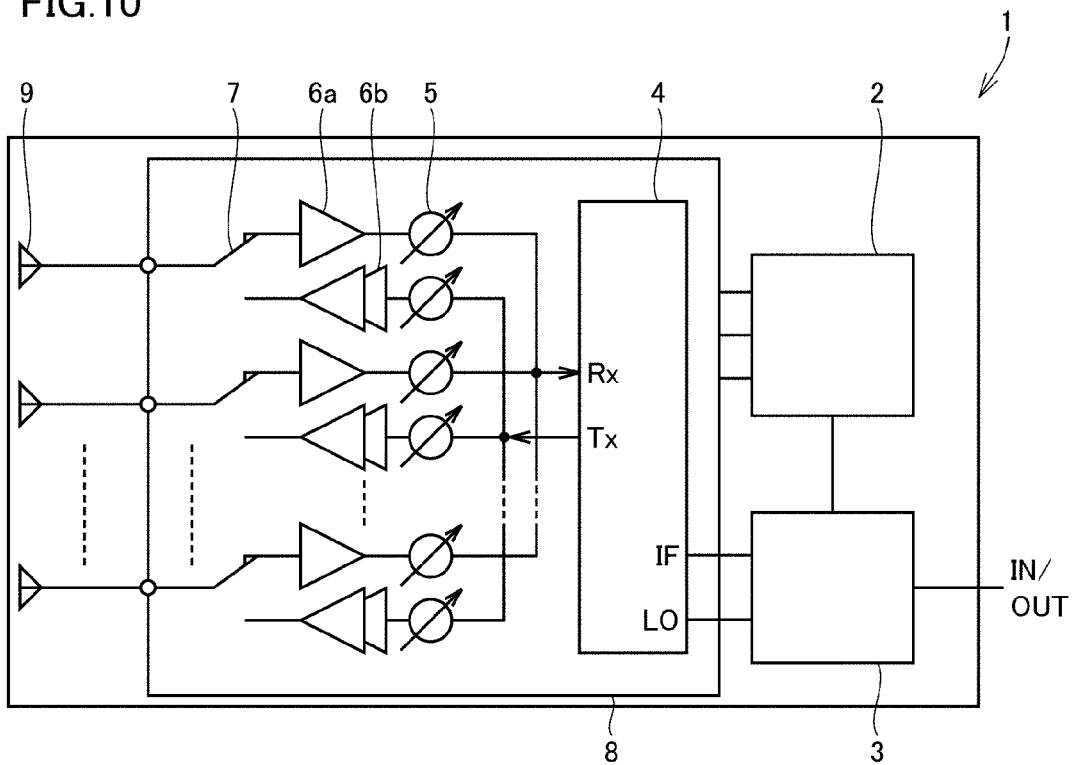
FIG. 10 is a circuit diagram illustrating the configuration of a communication module in which the antenna module according embodiment 1 of the present disclosure is used.

Next, an example of a communication module in which the antenna module 100 according to this embodiment is used will be described. FIG. 10 is a circuit diagram illustrating the configuration of a communication module in which the antenna module according embodiment 1 of the present disclosure is used.

As illustrated in FIG. 10, a communication module 1 includes a power source unit 2, a signal separating unit 3, a frequency converter 4, a plurality of phase shifters 5, a plurality of reception amplifiers 6a, a plurality of transmission amplifiers 6b, a plurality of transmission/reception switches 7, and a plurality of antennas 9. The frequency converter 4, the plurality of phase shifters 5, the plurality of reception amplifiers 6a, the plurality of transmission amplifiers 6b, and the plurality of transmission/reception switches 7 are provided in a transmission/reception integrated circuit (IC) 8.

The antenna elements 130 of the antenna module 100 correspond to the antennas 9, and the transmission/reception IC 8 is connected to the connection terminals 120 of the antenna module 100. Since the other main surface 112 of the antenna module 100 is flat, the connection terminals 120 and the transmission/reception IC 8 can be easily connected to each other.

In the antenna module 100 according to this embodiment, a part of each of the plurality of connection wiring lines 150 disposed in a region where the ground wiring line 140 is provided extends in a direction perpendicular to the other main surface 112 when viewed in a direction perpendicular to the other main surface 112, and therefore the electrical connections between the antenna elements 130 and the connection terminals 120 realized by the connection wiring lines 150 can be made stable.

Among the green sheets 10 to 18 including the via conductors 50, only the green sheet 18 on which the conductor patterns 30 that form the antenna elements 130 are provided is deformed into a curved shape, and therefore it is possible to secure stability for the electrical connections of the connection wiring lines 150 even in the case where the number of stacked green sheets is increased.

In addition, there is no need to form lands having large areas at the places where the via conductors 50 are connected to each other in the green sheets 14 to 17, and therefore continuity of the impedance of a load connected to an antenna can be maintained and antenna efficiency can be improved.

In the antenna module 100 according to this embodiment, the ground wiring line 140 comprises the via conductors 41 connecting the conductor patterns 40 to each other. The conductor patterns 40 consist of a plurality of ground layers disposed at positions so as to partially overlap with each other when viewed in a direction perpendicular to the other main surface 112 Thus, a sufficient grounding area can be secured and the potential of the ground wiring line 140 can be stabilized.

Furthermore, the ground wiring line 140 is connected to a plurality of connection terminals 120 by a plurality of connection wiring lines 160, and therefore the plurality of connection terminals 120, which are electrically connected to the ground wiring line 140, are grounded and consequently the impedance between the ground wiring line 140 and the ground potential can be made low. The potential of the ground wiring line 140 can also be stabilized in this way.

The plurality of antenna elements 130 are provided in an array pattern along the one main surface 111, which is spherically curved, and as a result a wide antenna radiation direction can be secured. In order to make the one main surface 111 have a smoother spherical shape, it is preferable that the thickness of each of the plurality of green sheets stacked in a pyramid shape be made small and that the number of green sheets stacked in a pyramid shape be made large.

Furthermore, damage and separation of the plurality of antenna elements 130 can be suppressed by providing the plurality of antenna elements 130 inside the base part 110.

A large number of antenna modules 100 can be manufactured at once, and therefore the antenna module 100 according to this embodiment is excellent in terms of mass production.

Embodiment 2

Hereafter, an antenna module according to embodiment 2 of the present disclosure will be described while referring to the drawings. An antenna module 200 according to embodiment 2 of the present disclosure mainly differs from the antenna module 100 according to embodiment 1 in that the antenna module 200 further includes a cover layer and radiation electrodes provided on the cover layer and in that electronic components are mounted therein, and therefore the description of the configurations that are the same as in the antenna module 100 according to embodiment 1 will not be repeated.

Figure 11:
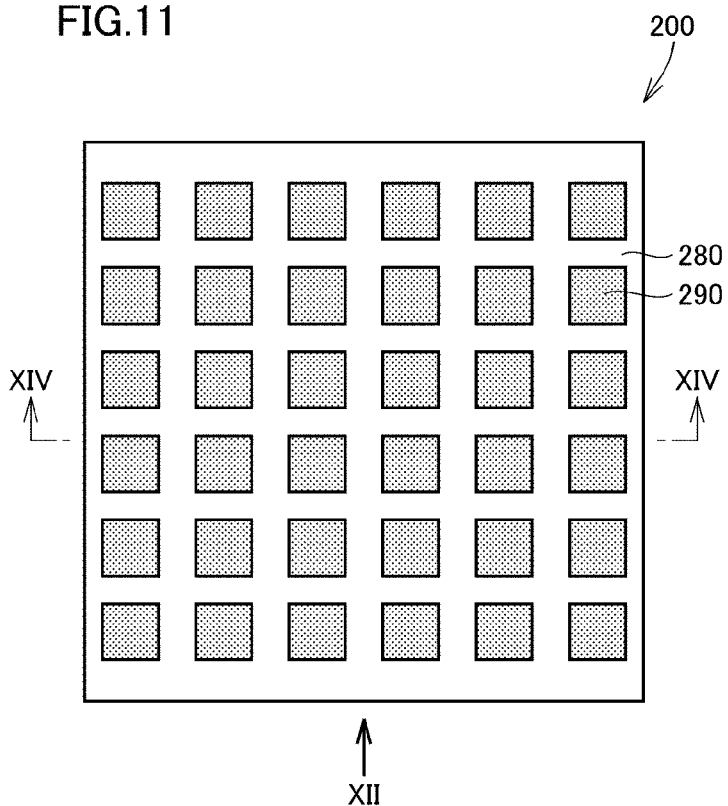
FIG. 11 is a plan view illustrating the exterior of an antenna module according to embodiment 2 of the present disclosure.
Figure 12:
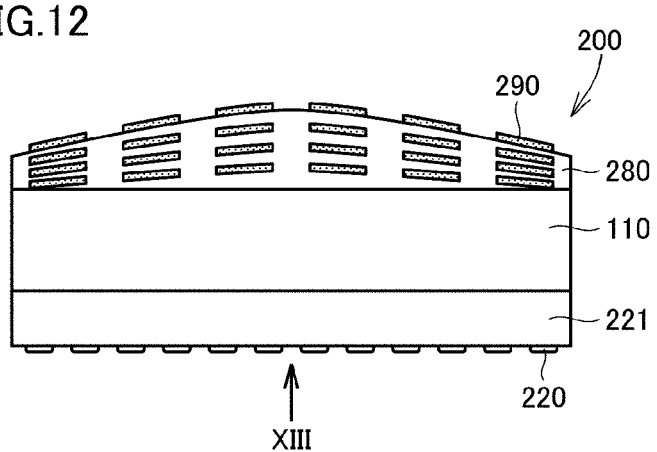
FIG. 12 is a side view in which the antenna module in FIG. 11 is viewed in the direction of arrow XII.
Figure 13:
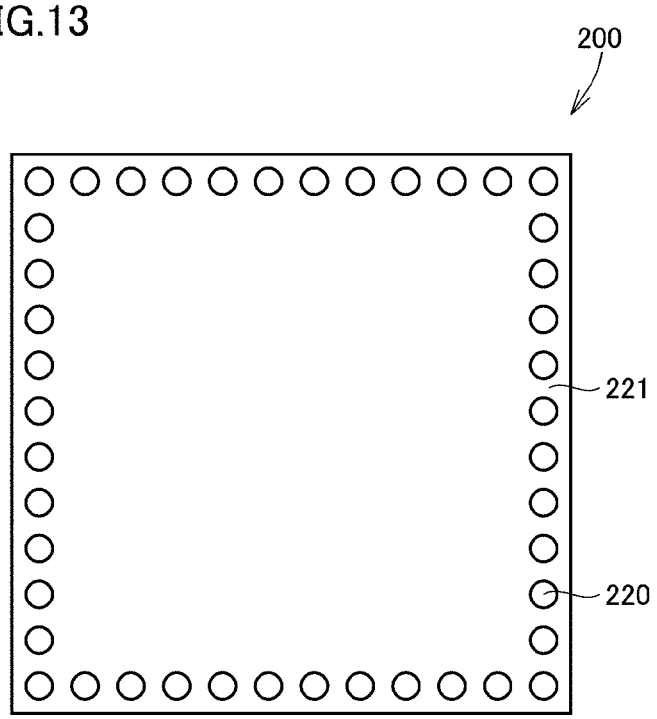
FIG. 13 is a rear view in which the antenna module in FIG. 12 is viewed in the direction of arrow XIII.
Figure 14:
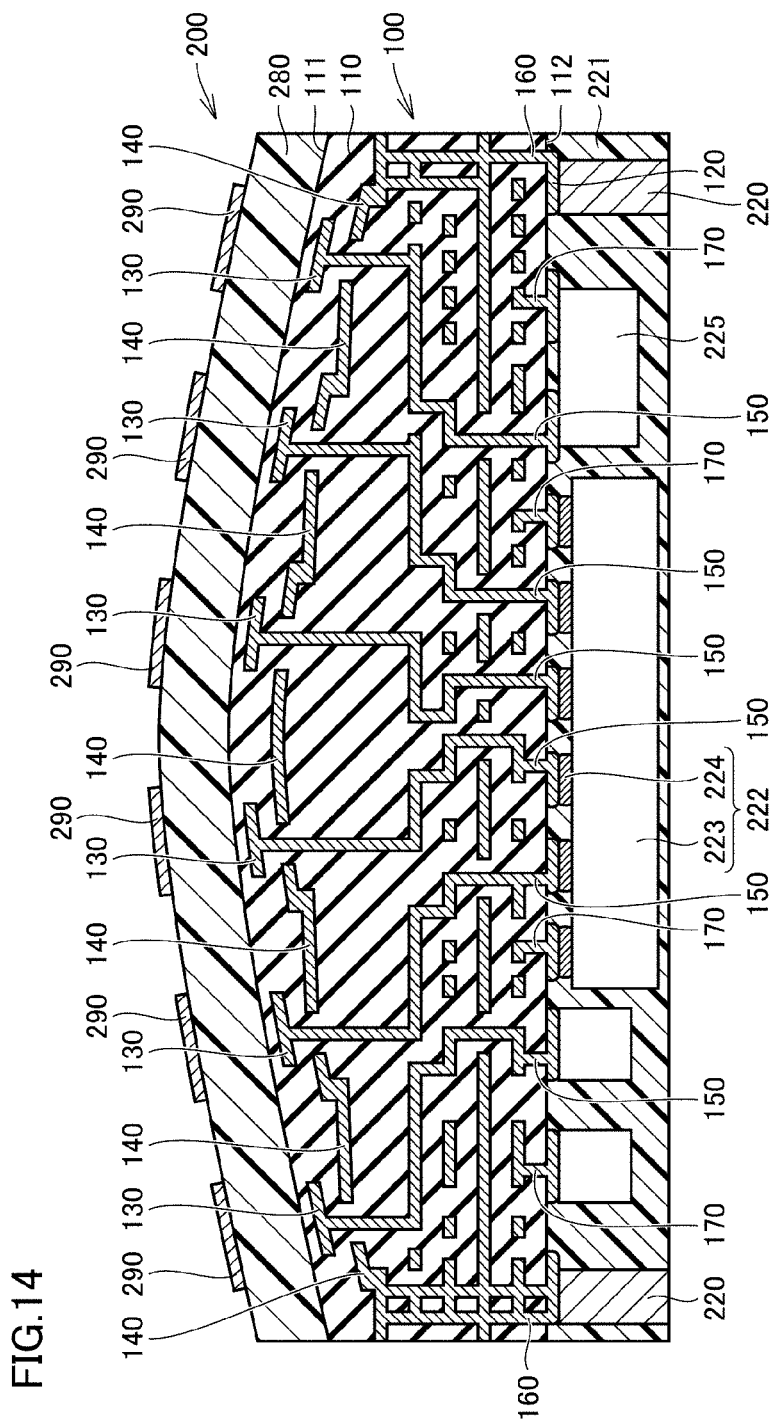
FIG. 14 is a sectional view in which the antenna module in FIG. 11 is viewed in the direction of the arrows of line XIV-XIV.

FIG. 11 is a plan view illustrating the exterior of the antenna module according to embodiment 2 of the present disclosure. FIG. 12 is a side view in which the antenna module in FIG. 11 is viewed in the direction of arrow XII. FIG. 13 is a rear view in which the antenna module in FIG. 12 is viewed in the direction of arrow XIII. FIG. 14 is a sectional view in which the antenna module in FIG. 11 is viewed in the direction of the arrows of line XIV-XIV.

As illustrated in FIGS. 11 to 14, the antenna module 200 according to embodiment 2 of the present disclosure includes: a base part 110; a plurality of connection terminals 220 that are for external connections; a plurality of antenna elements 130; a plurality of connection wiring lines 150; and a ground wiring line 140. The plurality of connection terminals 220 are connected to a group of the connection terminals 120 among the plurality of connection terminals 120 with a one-to-one correspondence. The plurality of connection terminals 220 are arrayed in the shape of a rectangle. An end surface of each of the plurality of connection terminals 220 is exposed from sealing resin 221, which will be described later. Each of the plurality of connection terminals 220 has a circular shape when viewed in a direction perpendicular to the other main surface of the base part 110.

The antenna module 200 according to embodiment 2 of the present disclosure further includes a cover layer 280. The cover layer 280 covers the one main surface 111 of the base part 110. The cover layer 280 is formed of a material having a dielectric constant between the dielectric constant of the dielectric forming the base part 110 and the dielectric constant of air. In this embodiment, the cover layer 280 is formed of a resin, but the material forming the cover layer 280 is not limited to being a resin. The cover layer 280 has a shape that follows the one main surface 111 of the base part 110 and is spherically curved so as to protrude outward.

The antenna module 200 further includes a plurality of radiation electrodes 290. The plurality of radiation electrodes 290 are provided on the cover layer 280. The plurality of radiation electrodes 290 are provided in an array pattern on the spherically curved cover layer 280. The plurality of radiation electrodes 290 are supplied with power in a contactless manner from the plurality of antenna elements 130.

The antenna module 200 further includes electronic components 222 and 235. The electronic components 222 and 235 are mounted on the other main surface 112 of the base part 110. The electronic components 222 and 235 are connected to another group of connection terminals 120 among the plurality of connection terminals 120. The electronic component 222 includes an IC chip 223 and solder bumps 224. The IC chip 223 corresponds to the transmission/reception IC 8 illustrated in FIG. 10. The electronic component 235 corresponds to the power source unit 2 and the signal separating unit 3. The number and types of electronic components included in the antenna module 200 are not limited to this example.

The antenna module 200 further includes the sealing resin 221 provided on the other main surface 112 of the base part 110. The other main surface 112 of the base part 110 is covered by the sealing resin 221. The electronic components 222 and 235 are sealed by the sealing resin 221.

Figure 15:
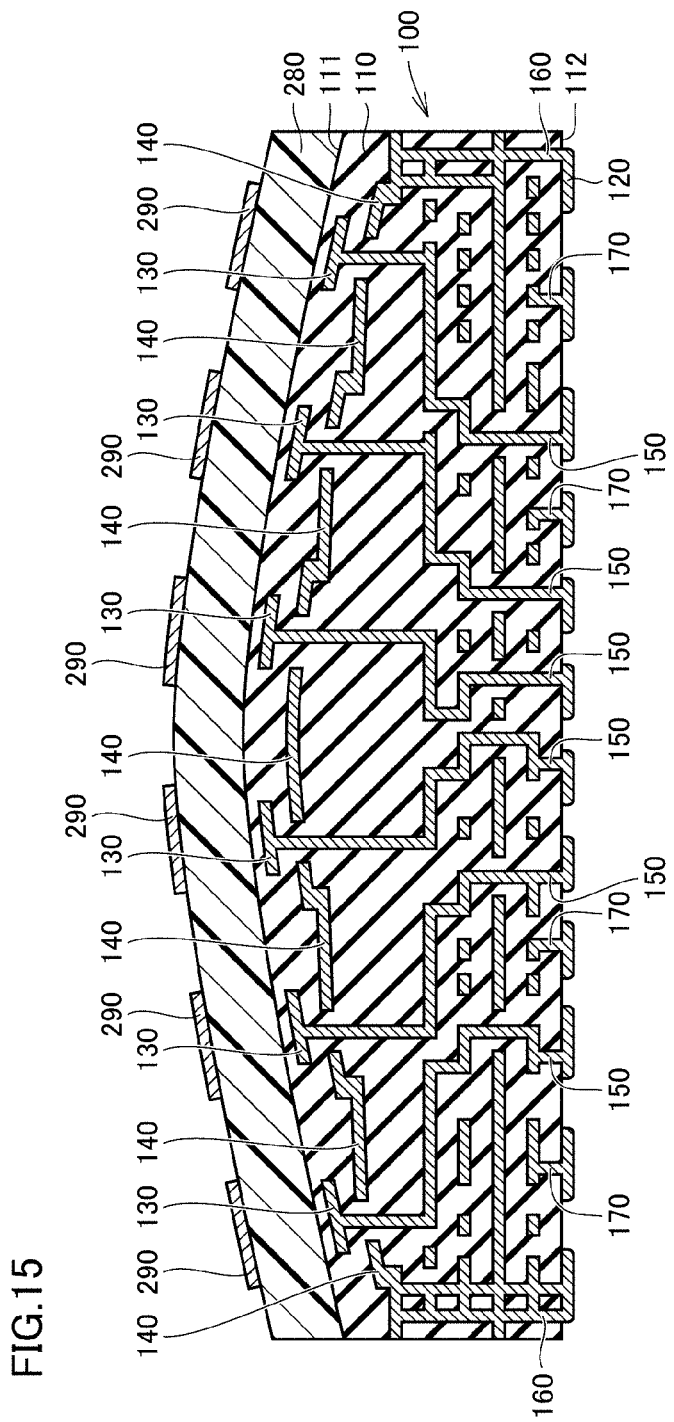
FIG. 15 is a sectional view illustrating a state in which a cover layer and radiation electrodes have been formed in the antenna module according to embodiment 2 of the present disclosure.
Figure 16:
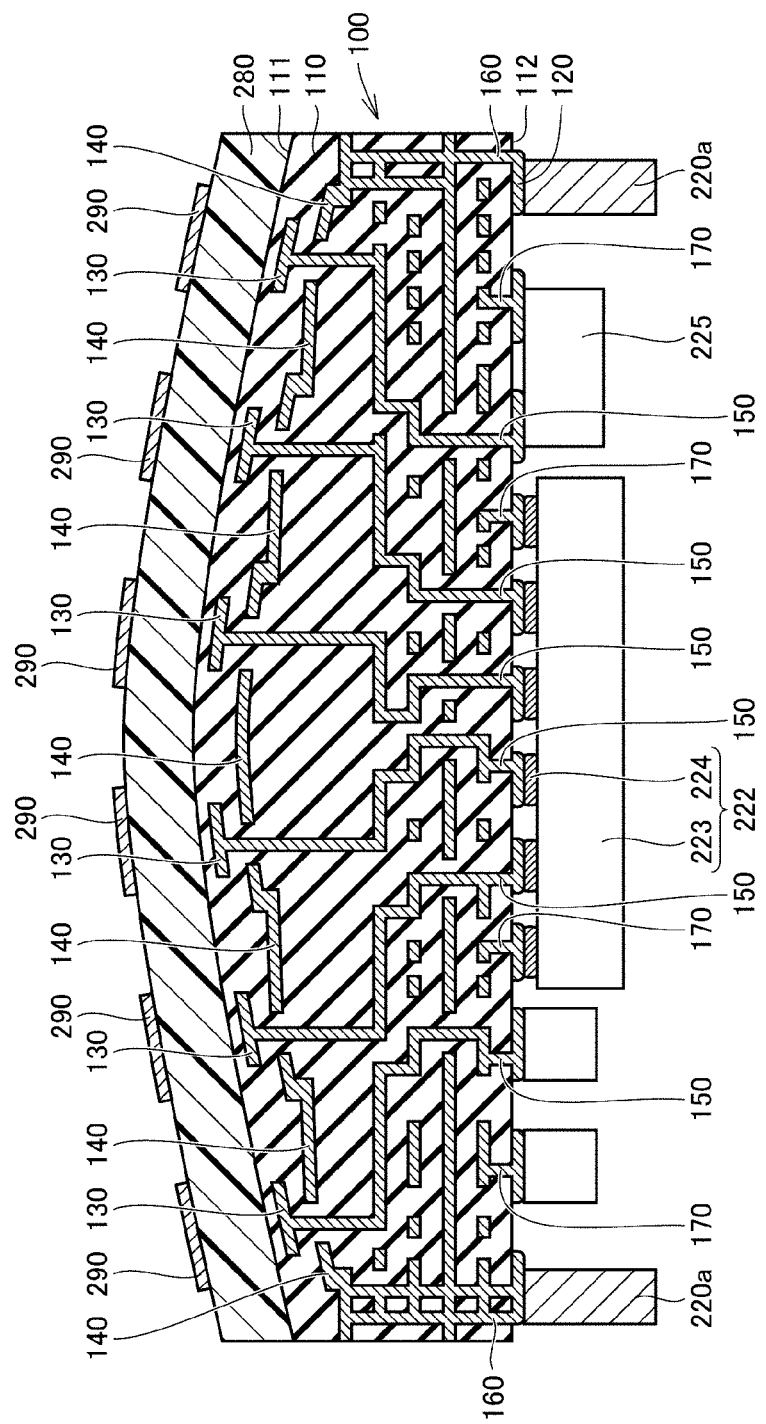
FIG. 16 is a sectional view illustrating a state in which electronic components have been mounted and columnar conductors serving as connection terminals have been formed on another main surface of a base part in the antenna module according to embodiment 2 of the present disclosure.
Figure 17:
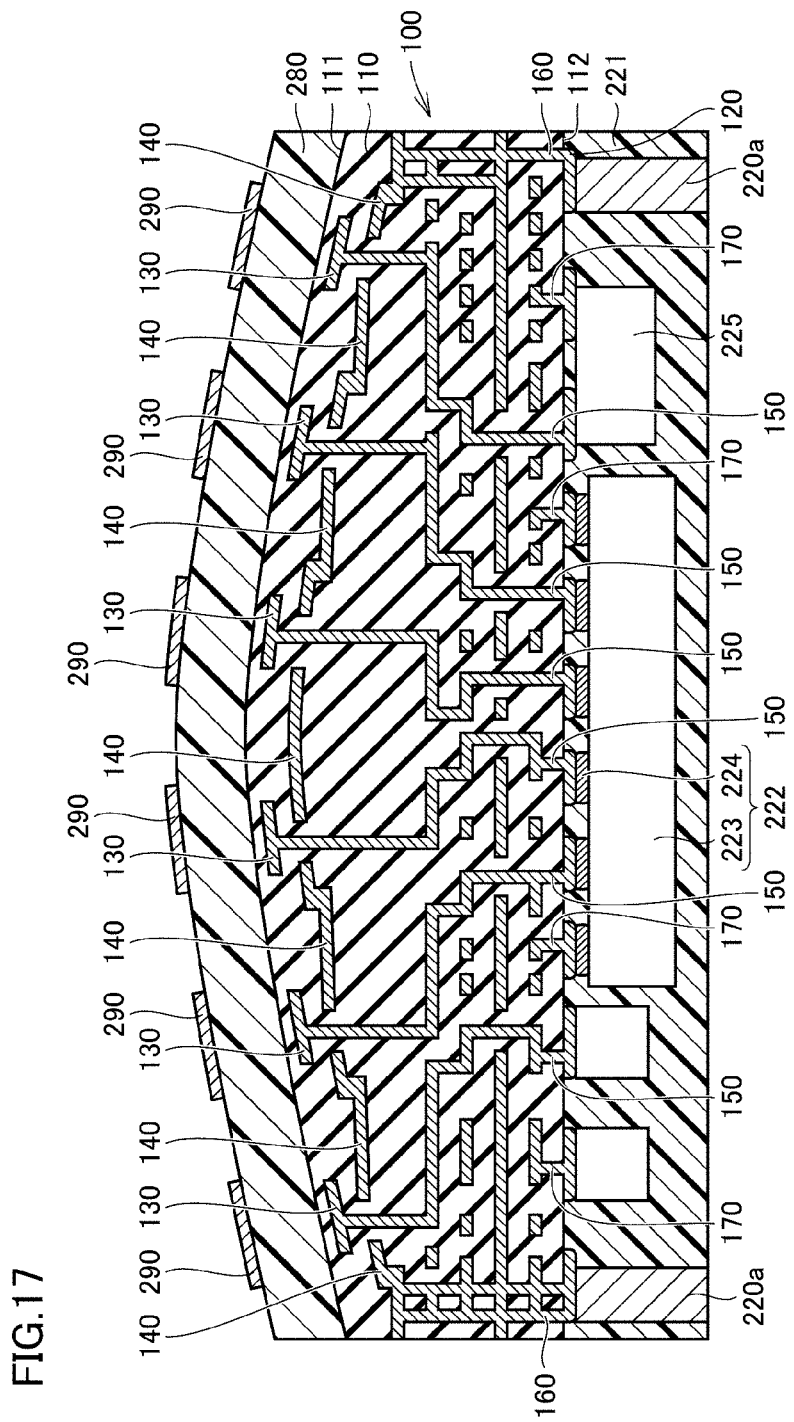
FIG. 17 is a sectional view illustrating a state in which sealing resin has been provided on the other main surface of the base part in the antenna module according to embodiment 2 of the present disclosure.

Hereafter, a method of manufacturing the antenna module 200 according to this embodiment will be described. FIG. 15 is a sectional view illustrating a state in which the covering layer and radiation electrodes have been formed in the antenna module according to embodiment 2 of the present disclosure. FIG. 16 is a sectional view illustrating a state in which electronic components have been mounted and columnar conductors serving as connection terminals have been formed on the other main surface of the base part in the antenna module according to embodiment 2 of the present disclosure. FIG. 17 is a sectional view illustrating a state in which sealing resin has been provided on the other main surface of the base part in the antenna module according to embodiment 2 of the present disclosure. The same cross section as in FIG. 14 is illustrated in FIGS. 15 to 17.

As illustrated in FIG. 15, when the antenna module 200 according to embodiment 2 of the present disclosure is manufactured, the cover layer 280 on which the plurality of radiation electrodes 290 are formed is provided on the one main surface 111 of the base part 110. Specifically, a resin sheet on which copper foil patterns forming the radiation electrodes 290 are formed is pressure bonded to the one main surface of the multilayer body prior to cutting of the multilayer body using a dicing machine. This resin sheet forms the cover layer 280.

Next, as illustrated in FIG. 16, the electronic components 222 and 225 are mounted on the other main surface 112 of the base part 110 and columnar conductors 220a, which form the connection terminals 220, are formed on the other main surface 112 of the base part 110.

Next, as illustrated in FIG. 17, the sealing resin 221 is provided on the other main surface 112 of the base part 110. Thus, the electronic components 222 and 225 are sealed by the sealing resin 221. After that, the antenna module 200 illustrated in FIG. 14 can be formed by removing the end portion of the sealing resin 221 on the opposite side from the base part 110 by performing cutting, grinding, or the like. The end surfaces of the connection terminals 220 that are exposed from the sealing resin 221 may be subjected to plating. After that, a plurality of the antenna modules 200 can be manufactured by cutting the multilayer body into individual pieces using a dicing machine.

The antenna module 200 according to this embodiment is provided with the cover layer 280, which is formed of a material having a dielectric constant between that of the dielectric forming the base part 110 and that of air, and consequently the impedance of radiation from the radiation electrodes 290 can be adjusted and the antenna efficiency can be improved.

Furthermore, the antenna module 200 according to this embodiment includes the radiation electrodes 290, which are supplied with power in a non-contact manner, and as a result the band width of radiation from the radiation electrodes 290 can be widened.

In addition, the electronic components 222 and 225, which form a communication circuit, are mounted in the antenna module 200 according to this embodiment and consequently communication modules that are compact, have low power loss, and have little variation in characteristics can be formed.

Configurations in the above description of the embodiments that can be combined with each other may be combined with each other.

The presently disclosed embodiments are illustrative in all points and should not be considered as limiting. The scope of the present disclosure is not defined by the above description but rather by the scope of the claims and it is intended that equivalents to the scope of the claims and all modifications within the scope of the claims be included within the scope of the present disclosure.

1 communication module, 2 power source unit, 3 signal separating unit, 4 frequency converter, 5 phase shifter, 6a reception amplifier, 6b transmission amplifier, 7 transmission/reception switch, 9 antenna, 10, 11, 12, 13, 14, 15, 16, 17, 18, 19 green sheet, 20, 30, 40, 71 conductor pattern, 41, 50, 60, 70 via conductor, 100, 200 antenna module, 100a multilayer body, 110 base part, 111 one main surface, 112 other main surface, 120, 220 connection terminal, 130 antenna element, 140 ground wiring line, 150, 160, 170 connection wiring line, 220a columnar conductor, 221 sealing resin, 222, 225, 235 electronic component, 223 IC chip, 224 solder bump, 280 cover layer, 290 radiation electrode.

The invention claimed is:

1. An antenna module comprising:
a base part having one main surface spherically curved so as to protrude outward and another main surface being flat, and comprising a dielectric;
a plurality of connection terminals for external connections provided on another main surface of the base part;
a plurality of antenna elements that are provided along the one main surface inside the base part;
a plurality of connection wiring lines that connect the plurality of connection terminals and the plurality of antenna elements to each other; and
a ground wiring line that is provided inside the base part, is arranged so as to surround a part of each of the plurality of connection wiring lines, and is grounded;
wherein a part of each of the plurality of connection wiring lines disposed in a region where the ground wiring line is provided extends in a direction perpendicular to the other main surface when viewed in a direction perpendicular to the other main surface.

2. The antenna module according to claim 1, wherein the ground wiring line comprises via conductors connecting a plurality of ground layers to each other, wherein the plurality of ground layers are disposed at positions so as to partially overlap with each other when viewed in a direction perpendicular to the other main surface.

3. The antenna module according to claim 1, further comprising:
a cover layer covering the one main surface of the base part and comprising a material having a dielectric constant between a dielectric constant of the dielectric and a dielectric constant of air.

4. The antenna module according to claim 3, further comprising:
a plurality of radiation electrodes provided on the cover layer; wherein the plurality of radiation electrodes are supplied with power from the plurality of antenna elements.

5. The antenna module according to claim 1, further comprising:
an electronic component mounted on the other main surface of the base part; wherein the electronic component is connected to some of the connection terminals among the plurality of connection terminals.

6. The antenna module according to claim 2, further comprising:
a cover layer covering the one main surface of the base part and comprising a material having a dielectric constant between a dielectric constant of the dielectric and a dielectric constant of air.

7. The antenna module according to claim 2, further comprising:
an electronic component mounted on the other main surface of the base part; wherein the electronic component is connected to some of the connection terminals among the plurality of connection terminals.

8. The antenna module according to claim 3, further comprising:
an electronic component mounted on the other main surface of the base part; wherein the electronic component is connected to some of the connection terminals among the plurality of connection terminals.

9. The antenna module according to claim 4, further comprising:
an electronic component mounted on the other main surface of the base part; wherein the electronic component is connected to some of the connection terminals among the plurality of connection terminals.

* * * * *

UNITED STATES PATENT AND TRADEMARK OFFICE
CERTIFICATE OF CORRECTION

| | | |
|---|---|---|
| PATENT NO. | : 10,868,369 B2 | Page 1 of 1 |
| APPLICATION NO. | : 16/507309 | |
| DATED | : December 15, 2020 | |
| INVENTOR(S) | : Shigeyuki Kamio et al. | |

It is certified that error appears in the above-identified patent and that said Letters Patent is hereby corrected as shown below:

In the Claims

Claim 1, Column 11, Line 23, "another" should be -- an other --.

Claim 1, Column 11, Line 26, "another" should be -- the other --.

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*